(12) United States Patent
Yaguchi et al.

(10) Patent No.: US 8,658,053 B2
(45) Date of Patent: Feb. 25, 2014

US008658053B2

(54) ETCHING COMPOSITION FOR METAL MATERIAL AND METHOD FOR MANUFACTURING SEMICONDUCTOR DEVICE BY USING SAME

(75) Inventors: Kazuyoshi Yaguchi, Tokyo (JP); Kojiro Abe, Chiba (JP); Masaru Ohto, Chiba (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 691 days.

(21) Appl. No.: 11/917,646

(22) PCT Filed: Jun. 22, 2006

(86) PCT No.: PCT/JP2006/312545
§ 371 (c)(1),
(2), (4) Date: Dec. 30, 2007

(87) PCT Pub. No.: WO2006/137497
PCT Pub. Date: Dec. 28, 2006

(65) Prior Publication Data
US 2010/0216315 A1 Aug. 26, 2010

(30) Foreign Application Priority Data
Jun. 24, 2005 (JP) ................. 2005-185695

(51) Int. Cl.
*C09K 13/08* (2006.01)
(52) U.S. Cl.
USPC ....... 252/79.3; 252/79.1; 252/79.2; 252/79.4; 216/84; 216/96; 216/102; 438/745
(58) Field of Classification Search
USPC ................... 252/79.1–79.4; 216/84, 96, 102; 438/745
See application file for complete search history.

(56) References Cited

U.S. PATENT DOCUMENTS

| 3,825,454 | A | 7/1974 | Kikuchi et al. |
| 6,323,169 | B1 * | 11/2001 | Abe et al. ................ 510/176 |
| 6,372,410 | B1 * | 4/2002 | Ikemoto et al. .............. 430/318 |
| 6,433,842 | B1 * | 8/2002 | Kaneko et al. ................. 349/43 |
| 6,447,563 | B1 | 9/2002 | Mahulikar |
| 6,589,884 | B1 * | 7/2003 | Torek ............................ 438/755 |
| 7,250,114 | B2 * | 7/2007 | Kiehlbauch et al. ........... 216/31 |
| 2002/0076930 | A1 | 6/2002 | Jo et al. |
| 2003/0209293 | A1 * | 11/2003 | Sako et al. .................... 148/273 |
| 2005/0003977 | A1 * | 1/2005 | Itano et al. .................... 510/175 |
| 2005/0101134 | A1 * | 5/2005 | Brask et al. ................... 438/689 |
| 2005/0118793 | A1 * | 6/2005 | Snyder et al. ................. 438/581 |

FOREIGN PATENT DOCUMENTS

| EP | 0 726 597 | 8/1996 |
| JP | 2001-093875 | 4/2001 |
| JP | 2002-016053 | 1/2002 |
| JP | 2002-155382 | 5/2002 |
| JP | 2002-528903 | 9/2002 |
| JP | 2003-174021 | 6/2003 |
| JP | 2004-068068 | 3/2004 |
| JP | 2004-296593 | 10/2004 |

OTHER PUBLICATIONS

Machine English Translation JP-2002-155382.*
Supplementary European Search Report and European Search Opinion dated Sep. 28, 2009, for Application No. EP 06 78 0631.

* cited by examiner

*Primary Examiner* — Shamim Ahmed
(74) *Attorney, Agent, or Firm* — Antonelli, Terry, Stout & Kraus, LLP.

(57) ABSTRACT

Disclosed is an etchant composition employed for selectively etching a metallic material in production of a semiconductor device, which is an aqueous solution containing a fluorine compound, and a chelating agent having, in the molecular structure thereof, a phosphorus oxo-acid as a functional group; or is an aqueous solution containing a fluorine compound, a chelating agent having, in the molecular structure thereof, a phosphorus oxo-acid as a functional group, and an inorganic acid and/or an organic acid. Also disclosed is a method for producing a semiconductor device employing the etchant composition.

16 Claims, No Drawings

ETCHING COMPOSITION FOR METAL MATERIAL AND METHOD FOR MANUFACTURING SEMICONDUCTOR DEVICE BY USING SAME

TECHNICAL FIELD

The present invention relates to an etchant composition employed for selectively and efficiently etching a metallic material in production of a semiconductor device from an insulating material having high dielectric constant, an insulating material of silicon oxide film or silicon nitride film, and a metallic material; and to a method for producing a semiconductor device by use of the etchant composition.

BACKGROUND ART

Recent progress in highly integrated semiconductor devices and thin gate insulating layers causes problems during application of gate bias, including an increase in tunnel current through an insulating layer, signal delay, and reduction of driving force.

One possible approach for suppressing problematic increase in tunnel current is employment of an insulating material having a dielectric constant of 10 or more instead of silicon oxide, which has a dielectric constant of 3.9. Attempts have been made to employ, as a candidate for such an insulating material having high dielectric constant, $Al_2O_3$, $HfO_2$, a rare earth element oxide, for example $Y_2O_3$ and $ZrO_2$, or a lanthanoid oxide. When such an insulating material having high dielectric constant is employed for forming a gate insulating layer, even if the length of the gate is reduced, the thickness of the gate insulating layer can be controlled to such a level that prevents tunnel current, while the capacitance of the gate insulating layer is maintained on the basis of the scaling law.

In order to reduce problematic signal delay or reduction of driving force, attempts have been made to employ, as a gate electrode material, a metallic material instead of polysilicon, which has been conventionally used. When a metallic material is employed as a gate electrode material, gate and source/drain resistance can be reduced, and signal delay in a semiconductor device can be reduced. In addition, gate depletion, which would otherwise be observed in a polysilicon electrode, does not occur, and driving force can be enhanced. When an insulating material having high dielectric constant is employed in combination with a metallic material, synergistic effects are obtained; i.e., performance of a semiconductor device can be maintained at high level, with tunnel current being reduced.

Production of a semiconductor device from such an insulating material having high dielectric constant, an insulating material of silicon oxide film or silicon nitride film, and a metallic material requires a step of selectively etching the metallic material. For example, in a process of patterning a metallic material only in a first gate region of a dual gates transistor, an insulating material having high dielectric constant and the metallic material are deposited on an insulating material, followed by a step of etching only the metallic material within a second gate region. When a conventional dry etching technique employing plasma gas is applied to this etching step, etching selectivity fails to be attained between the metallic material, the insulating material and the insulating material having high dielectric constant, and the insulating material and the insulating material having high dielectric constant undergo etching, resulting in difficulty in precise processing. Meanwhile, there has not yet been reported a technique for etching a metallic material through wet etching.

Under such circumstances, demand has arisen for a technique for selectively and efficiently etching only a metallic material while reducing corrosion to an insulating material having high dielectric constant or an insulating material of, for example, silicon oxide film or silicon nitride film (hereinafter may be abbreviated as "oxide film or nitride film").

DISCLOSURE OF THE INVENTION

The present invention relates to an etchant employed for selectively and efficiently etching a metallic material in production of a semiconductor device from an insulating material having high dielectric constant, an insulating material of oxide film or nitride film, and a metallic material, which materials are essential for reduction of tunnel current, reduction of signal delay, and enhancement of driving force in the semiconductor device. An object of the present invention is to provide an etchant composition for selectively and efficiently etching a metallic material while reducing corrosion to an insulating material having high dielectric constant or an insulating material of oxide film or nitride film.

In order to establish a technique for selectively etching a metallic material for solving the aforementioned problems, the present inventors have conducted extensive studies, and as a result have found that a metallic material can be finely processed through etching by use of an etchant composition prepared by adding a chelating agent having, in the molecular structure thereof, a phosphorus oxo-acid as a functional group to an aqueous solution containing a fluorine compound or to an aqueous solution containing a fluorine compound, and an inorganic acid or an organic acid; and that the etchant composition exhibits remarkably excellent properties; i.e., the etchant composition is less corrosive to an insulating material having high dielectric constant or an insulating material of oxide film or nitride film. The present invention has been accomplished on the basis of these findings.

Accordingly, the present invention is directed to an etchant composition for a metallic material, and a method for producing a semiconductor device by use of the etchant composition, which are described below.

1. An etchant composition employed for selectively etching a metallic material in production of a semiconductor device from an insulating material having high dielectric constant, an insulating material of silicon oxide film or silicon nitride film, and a metallic material, characterized in that the etchant composition is an aqueous solution containing a fluorine compound, and a chelating agent having, in the molecular structure thereof, a phosphorus oxo-acid as a functional group.

2. An etchant composition employed for selectively etching a metallic material in production of a semiconductor device from an insulating material having high dielectric constant, an insulating material of silicon oxide film or silicon nitride film, and a metallic material, characterized in that the etchant composition is an aqueous solution containing a fluorine compound, a chelating agent having, in the molecular structure thereof, a phosphorus oxo-acid as a functional group, and an inorganic acid and/or an organic acid.

3. An etchant composition as described in 1 above, wherein the amount of the fluorine compound is 0.001 to 10 mass %, and the amount of the chelating agent having, in the molecular structure thereof, a phosphorus oxo-acid as a functional group is 0.001 to 10 mass %.

4. An etchant composition as described in 2 above, wherein the amount of the fluorine compound is 0.001 to 10 mass %, the amount of the inorganic acid is 50 mass % or less, and the amount of the chelating agent having, in the molecular structure thereof, a phosphorus oxo-acid as a functional group is 0.001 to 10 mass %.

5. An etchant composition as described in 2 above, wherein the amount of the fluorine compound is 0.001 to 10 mass %, the amount of the organic acid is 15 mass % or less, and the amount of the chelating agent having, in the molecular structure thereof, a phosphorus oxo-acid as a functional group is 0.001 to 10 mass %.

6. An etchant composition as described in any of 1 to 5 above, wherein the fluorine compound is at least one species selected from among hydrofluoric acid, ammonium fluoride, tetramethylammonium fluoride, sodium fluoride, and potassium fluoride.

7. An etchant composition as described in 2 or 4 above, wherein the inorganic acid is at least one species selected from among sulfuric acid, nitric acid, hydrochloric acid, phosphoric acid, sulfamic acid, nitrous acid, and amidosulfuric acid.

8. An etchant composition as described in 2 or 5 above, wherein the organic acid is at least one species selected from among formic acid, oxalic acid, citric acid, malonic acid, succinic acid, acetic acid, propionic acid, malic acid, and tartaric acid.

9. An etchant composition as described in any of 1 to 8 above, wherein the metallic material is Al, Co, Cr, Cu, Fe, Hf, Mo, Nb, Ni, Pt, Ru, Ta, Ti, W, or Zr; or a material containing any of these metals and a silicon atom and/or a nitrogen atom.

10. An etchant composition as described in any of 1 to 8 above, wherein the insulating material having high dielectric constant is $Al_2O_3$, $CeO_3$, $Dy_2O_3$, $Er_2O_3$, $Eu_2O_3$, $Gd_2O_3$, $Hf_2$, $Ho_2O_3$, $La_2O_3$, $Lu_2O_3$, $Nb_2O_5$, $Nd_2O_3$, $Pr_2O_3$, $ScO_3$, $Sm_2O_3$, $Ta_2O_5$, $Tb_2O_3$, $TiO_2$, $Tm_2O_3$, $Y_2O_3$, $Yb_2O_3$, or $ZrO_2$; or a material containing any of these metal oxides and a silicon atom and/or a nitrogen atom.

11. A method for producing a semiconductor device characterized by comprising selectively etching a metallic material by use of an etchant composition as recited in any of 1 to 8 above, without causing corrosion of an insulating material having high dielectric constant or an insulating material of silicon oxide film or silicon nitride film.

BEST MODES FOR CARRYING OUT THE INVENTION

Examples of fluorine compounds employed in the present invention include hydrofluoric acid; ammonium fluoride; ammonium hydrogen fluoride; cerium fluoride; silicon tetrafluoride; fluorosilicic acid; nitrogen fluoride; phosphorus fluoride; vinylidene fluoride; boron trifluoride; borofluoric acid; fluorine compound salts such as ammonium fluoroborate, monoethanolamine hydrofluoride, methylamine hydrofluoride, ethylamine hydrofluoride, propylamine hydrofluoride, tetramethylammonium fluoride, tetraethylammonium fluoride, triethylmethylammonium fluoride, trimethylhydroxyethylammonium fluoride, tetraethoxyammonium fluoride, and methyltriethoxyammonium fluoride; and metal-fluorine compounds such as lithium fluoride, sodium fluoride, acidic sodium fluoride, potassium fluoride, acidic potassium fluoride, potassium fluorosilicate, potassium hexafluorophosphate, magnesium fluoride, calcium fluoride, strontium fluoride, barium fluoride, zinc fluoride, aluminum fluoride, stannous fluoride, lead fluoride, and antimony trifluoride. Of these, preferred fluorine compounds are hydrofluoric acid, ammonium fluoride, tetramethylammonium fluoride, sodium fluoride, and potassium fluoride.

In the present invention, the aforementioned fluorine compounds may be employed singly or in combination of two or more species.

The concentration of the fluorine compound in the etchant composition preferably falls within a range of 0.001 to 10 mass %. When the concentration of the fluorine compound is 0.001 mass % or more, a metallic material is etched at a high rate, whereas when the concentration of the fluorine compound is 10 mass % or less, an insulating material having high dielectric constant or an insulating material of oxide film or nitride film can be prevented from being corroded.

Examples of chelating agents employed in the present invention, each of which has, in the molecular structure thereof, a phosphorus oxo-acid as a functional group, include phosphonic acid chelating agents such as methyldiphosphonic acid, aminotrismethylenephosphonic acid, 1-hydroxyethylidene-1,1-diphosphonic acid, ethylaminobismethylenephosphonic acid, dodecylaminobismethylenephosphonic acid, nitrilotrismethylenephosphonic acid, ethylenediaminebismethylenephosphonic acid, ethylenediaminetetrakismethylenephosphonic acid, hexenediaminetetrakismethylenephosphonic acid, diethylenetriaminepentamethylenephosphonic acid, and 1,2-propanediaminetetramethylenephosphonic acid, each of which has a phosphonic acid group in the molecule thereof; ammonium salts, organic amine salts, and alkali metal salts of these phosphonic acid chelating agents; N-oxide forms thereof, whose nitrogen atom in the molecules is oxidized; aminoalkylphosphoric acid chelating agents such as orthophosphoric acid, pyrophosphoric acid, metaphosphoric acid, trimetaphosphoric acid, tetrametaphosphoric acid, hexametaphosphoric acid, and tripolyphosphoric acid; ammonium salts, organic amine salts, and alkali metal salts of these aminoalkylphosphoric acid chelating agents; N-oxide forms thereof, whose nitrogen atom in the molecules is oxidized; phosphinic acid chelating agents such as 8-quinolylphosphinic acid and 2-aminoethylphosphinic acid, each of which has a phosphinic acid group in the molecule thereof; ammonium salts, organic amine salts, and alkali metal salts of these phosphinic acid chelating agents; and N-oxide forms thereof, whose nitrogen atom in the molecules is oxidized. Of these chelating agents, diphosphonic acids, nitrilomethylenephosphonic acids, and pentamethylenephosphonic acids are preferred.

The aforementioned chelating agents, each having, in the molecular structure thereof, a phosphorus oxo-acid as a functional group, may be employed singly or in combination of two or more species. The etchant composition contains a chelating agent having, in the molecular structure thereof, a phosphorus oxo-acid as a functional group, preferably at a concentration of 0.001 to 10 mass %. When the concentration of the chelating agent is 0.001 mass % or more, effects by addition of the chelating agent can be attained, whereas when the concentration of the chelating agent is 10 mass % or less, precipitation of crystals can be prevented in the etchant composition.

Examples of inorganic acids employed in the present invention include sulfuric acid, nitric acid, hydrochloric acid, phosphoric acid, hypophosphorous acid, carbonic acid, sulfamic acid, boric acid, phosphonic acid, phosphinic acid, nitrous acid, and amidosulfuric acid. Of these, sulfuric acid, nitric acid, hydrochloric acid, phosphoric acid, sulfamic acid, nitrous acid, and amidosulfuric acid are preferred.

The concentration of the inorganic acid in the etchant composition—which is appropriately determined on the basis of the solubility of the inorganic acid in water contained in the composition—is preferably 50 mass % or less. Setting the concentration of the inorganic acid to 50 mass % or less can prevent etching of a material which is basically not desirable to be damaged through etching; i.e., a material other than a metallic material which is a target of etching.

Examples of organic acids employed in the present invention include oxalic acid, succinic acid, malonic acid, propionic acid, acetic acid, maleic acid, glycolic acid, diglycolic acid, tartaric acid, itaconic acid, pyruvic acid, malic acid, adipic acid, formic acid, phthalic acid, benzoic acid, salicylic acid, carbamic acid, thiocyanic acid, lactic acid, and citric acid. Of these, oxalic acid, citric acid, malonic acid, succinic acid, acetic acid, propionic acid, malic acid, and tartaric acid are preferred.

The concentration of the organic acid in the etchant composition—which is appropriately determined on the basis of the solubility of the organic acid in water contained in the composition—is preferably 15 mass % or less. When the concentration of the organic acid is 15 mass % or less, precipitation of crystals can be prevented in the etchant composition.

In the present invention, the aforementioned inorganic acids or organic acids may be employed singly or in combination of two or more species. Through addition of any of the aforementioned organic acids or inorganic acids, an insulating material of silicon oxide film or silicon nitride film is less likely to be etched, and a metallic material can be etched more efficiently.

The etchant composition of the present invention may be employed after removal of a naturally oxidized film on a surface layer of a metallic material by use of hydrofluoric acid. Through such a preliminary treatment with hydrofluoric acid, the metallic material can be etched more efficiently.

The etchant composition of the present invention, which is generally employed in a step of etching the entirety of a metallic material (i.e., an etching target). The composition may also be employed for removal of an unetched portion of the metallic material after the metallic material has been etched, through a conventional dry etching technique employing plasma gas, to such an extent that no damage is incurred to an insulating material having high dielectric constant or an insulating material of oxide film or nitride film.

The etchant composition of the present invention may contain a conventionally employed additive, for the purpose of improving performance of the etchant composition; for example, improving wettability of the etchant composition, preventing deposition of particles on a wafer or metal contamination of a wafer after treatment of the wafer, or suppressing damage to an insulating material. Examples of such an additive include surfactant compounds, water-soluble polymers, and water-soluble or water-miscible organic solvents. These additives may be employed so long as they are soluble in the etchant composition of the present invention, and may be employed singly or in combination of two or more species.

No particular limitation is imposed on the pH of the etchant composition of the present invention, and the pH may be determined in consideration of, for example, etching conditions or the type of a semiconductor material employed. When the etchant composition is employed under alkaline conditions, for example, ammonia, an amine, or a quaternary ammonium hydroxide (e.g., tetramethylammonium hydroxide) may be added, whereas when the etchant composition is employed under acidic conditions, for example, an inorganic acid or an organic acid may be added.

The temperature at which the etchant composition of the present invention is employed, and the time for which the etchant composition is employed are appropriately determined in consideration of the type of a metallic material (i.e., an etching target) or the target etching amount.

The etchant composition of the present invention may be applied to a metallic material containing at least one species selected from among Al, Co, Cr, Cu, Fe, Hf, Mo, Ni, Pt, Ru, Ta, Ti, W, and Zr, more preferably selected from among Co, Hf, Ni, Ta, Ti, and W. The etchant composition may also be applied to a material containing such a metal, and either a silicon atom or a nitrogen atom; or a material containing such a metal, and both a silicon atom and a nitrogen atom. The etchant composition may also be applied to a mixture of two of the aforementioned materials, or to stacked layers made of two of the aforementioned materials.

The etchant composition of the present invention may be applied to an insulating material having high dielectric constant at least one species selected from among $Al_2O_3$, $CeO_3$, $Dy_2O_3$, $Er_2O_3$, $Eu_2O_3$, $Gd_2O_3$, $HfO_2$, $Ho_2O_3$, $La_2O_3$, $Lu_2O_3$, $Nb_2O_5$, $Nd_2O_3$, $Pr_2O_3$, $ScO_3$, $Sm_2O_3$, $Ta_2O_5$, $Tb_2O_3$, $TiO_2$, $Tm_2O_3$, $Y_2O_3$, $Yb_2O_3$, and $ZrO_2$, more preferably selected from among $Al_2O_3$, $HfO_2$, $Ta_2O_5$, and $ZrO_2$. The etchant composition may also be applied to a material containing such a metal oxide, and a silicon atom and a nitrogen atom; or a material containing such a metal oxide, and both a silicon atom and a nitrogen atom. The etchant composition may also be applied to a mixture of two of the aforementioned materials, or to stacked layers made of two of the aforementioned materials.

EXAMPLES

The present invention will next be described in more detail with reference to Examples and Comparative Examples, which should not be construed as limiting the invention thereto.

Examples 1 to 14 and Comparative Examples 1 to 14

On a silicon wafer substrate were provided th-$SiO_2$, that is an insulating material, and HfSiON, that is an insulating material having high dielectric constant, to thereby form a wafer sample. Etching performance of an etchant composition was evaluated by use of the wafer sample. The results are shown in Table 1. The etchant composition was evaluated on the basis of etching feature of HfSiON, that is an insulating material having high dielectric constant, according to the following ratings:

◯: virtually no etching of HfSiON (5 Å/minute or less);
Δ: slight etching of HfSiON (5 to 50 Å/minute); and
×: etching of HfSiON to a large extent (50 Å/minute or more).

On a silicon wafer substrate was provided th-$SiO_2$, that is an insulating material, to thereby form a wafer sample. Etching performance of an etchant composition was evaluated by use of the wafer sample. The results are also shown in Table 1.

The etchant composition was evaluated on the basis of etching feature of th-$SiO_2$, that is an insulating material, according to the following ratings:

◯: virtually no etching of th-$SiO_2$ (5 Å/minute or less);
Δ: slight etching of th-$SiO_2$ (5 to 50 Å/minute); and
×: etching of th-$SiO_2$ to a large extent (50 Å/minute or more).

On a silicon wafer substrate were provided th-$SiO_2$, that is an insulating material, and Ti which is in the form of pure metal, to thereby form a wafer sample. Etching performance of an etchant composition was evaluated by use of the wafer sample. The results are also shown in Table 1.

The etchant composition was evaluated on the basis of etching feature of Ti which is in the form of pure metal according to the following ratings:

○: clear etching of Ti;
Δ: slight etching of Ti; and
x: no etching of Ti.

Examples 15 to 28 and Comparative Examples 15 to 28

HfSiON, that is an insulating material having high dielectric constant, and th-SiO$_2$, that is an insulating material, were treated with an etchant composition having a formulation shown in Table 2, and etching performance of the etchant composition was evaluated. Furthermore, etching performance of the etchant composition was evaluated by use of a wafer sample formed from HfSi, that is a metallic material containing a silicon atom. The results are shown in Table 2.

The etchant composition was evaluated on the basis of etching feature of HfSi, that is a metallic material containing a silicon atom, according to the following ratings:
○: clear etching of HfSi;
Δ: slight etching of HfSi; and
x: no etching of HfSi.

Examples 29 to 42 and Comparative Examples 29 to 42

HfSiON, that is an insulating material having high dielectric constant, and th-SiO$_2$, that is an insulating material, were treated with an etchant composition having a formulation shown in Table 3, and etching performance of the etchant composition was evaluated. Furthermore, etching performance of the etchant composition was evaluated by use of a wafer sample formed from HfN, that is a metallic material containing a nitrogen atom. The results are shown in Table 3.

The etchant composition was evaluated on the basis of etching feature of HfN, that is a metallic material containing a nitrogen atom, according to the following ratings:
○: clear etching of HfN;
Δ: slight etching of HfN; and
x: no etching of HfN.

Examples 43 to 56 and Comparative Examples 43 to 56

HfSiON, that is an insulating material having high dielectric constant, and th-SiO$_2$, that is an insulating material, were treated with an etchant composition having a formulation shown in Table 4, and etching performance of the etchant composition was evaluated. Furthermore, etching performance of the etchant composition was evaluated by use of a wafer sample formed from TaSiN, that is a metallic material containing both a silicon atom and a nitrogen atom. The results are shown in Table 4. The etchant composition was evaluated on the basis of etching feature of TaSiN (i.e., a metallic material containing both a silicon atom and a nitrogen atom) according to the following ratings:
○: clear etching of TaSiN;
Δ: slight etching of TaSiN; and
x: no etching of TaSiN.

Etching performance of the etchant composition of Comparative Example 8, 22, 36, 50 was not evaluated, since crystals were precipitated in the etchant composition.

As is clear from Tables 1, 2, 3, and 4, when the etchant composition of the present invention is employed, a metallic material is etched as desired, and the etching rate of an insulating material having high dielectric constant or an insulating material of oxide film or nitride film is suppressed.

Thus, when the etchant composition of the present invention is employed for etching of an insulating material having high dielectric constant or a metallic material, etching of the insulating material having high dielectric constant, for example HfO$_2$, HfSiON, Ta$_2$O$_5$, or ZrO$_2$, is suppressed. Therefore, the etchant composition is less corrosive to an insulating material having high dielectric constant or an insulating material of oxide film or nitride film, and realizes selective and efficient etching of a metallic material.

TABLE 1

| | | Fluorine compound | | Acid | | Chelating agent | | Treatment temp. °C. | Insulating material having high dielectric constant HfSiON | Insulating material th-SiO$_2$ | Metallic material Ti |
|---|---|---|---|---|---|---|---|---|---|---|---|
| | | Species | Conc. mass % | Species | Conc. mass % | Species | Conc. mass % | | | | |
| Ex. | 1 | Hydrofluoric acid | 0.1 | — | — | Diethylene-triaminepenta-methylene-phosphonic acid | 0.05 | 25 | ○ | ○ | ○ |
| | 2 | Ammonium fluoride | 0.2 | Sulfuric acid | 10 | 1-Hydroxyethane-1,1-diphosphonic acid | 2 | 25 | ○ | ○ | ○ |
| | 3 | Tetramethyl-ammonium fluoride | 0.5 | Sulfuric acid | 10 | 1-Hydroxyethane-1,1-diphosphonic acid | 2 | 25 | ○ | ○ | ○ |
| | 4 | Acidic sodium fluoride | 1.0 | Hydro-chloric acid | 15 | Methyl-diphosphonic acid | 1 | 25 | ○ | ○ | ○ |
| | 5 | Acidic sodium fluoride | 1.0 | Hydro-chloric acid | 15 | Methyl-diphosphonic acid | 2 | 25 | ○ | ○ | ○ |
| | 6 | Hydrofluoric acid | 0.1 | Hydro-chloric acid | 10 | Diethylene-triamine-pentamethylene-phosphonic acid | 1 | 60 | ○ | ○ | ○ |
| | 7 | Acidic sodium fluoride | 1.0 | Hydro-chloric acid | 15 | Methyl-diphosphonic acid | 5 | 25 | ○ | ○ | ○ |

TABLE 1-continued

|  |  | Fluorine compound | | Acid | | Chelating agent | | Treatment temp. ° C. | Insulating material having high dielectric constant HfSiON | Insulating material th-SiO$_2$ | Metallic material Ti |
|---|---|---|---|---|---|---|---|---|---|---|---|
|  |  | Species | Conc. mass % | Species | Conc. mass % | Species | Conc. mass % |  |  |  |  |
| Ex. | 8 | Hydrofluoric acid | 0.05 | Oxalic acid | 3 | Nitrilo-trismethylene-phosphonic acid | 0.05 | 25 | ○ | ○ | ○ |
|  | 9 | Tetramethyl-ammonium fluoride | 1 | Nitric acid | 5 | Nitrilo-trismethylene-phosphonic acid | 0.05 | 25 | ○ | ○ | ○ |
|  | 10 | Ammonium fluoride | 0.2 | Formic acid | 5 | Nitrilo-trismethylene-phosphonic acid | 0.05 | 25 | ○ | ○ | ○ |
|  | 11 | Ammonium fluoride | 0.2 | Formic acid | 5 | 1-Hydroxyethane-1,1-diphosphonic acid | 1 | 25 | ○ | ○ | ○ |
|  | 12 | Ammonium fluoride | 0.2 | Formic acid / Hydrochloric acid | 5 / 5 | Methyl-diphosphonic acid | 1 | 25 | ○ | ○ | ○ |
|  | 13 | Ammonium fluoride | 0.2 | Formic acid | 5 | Methyl-diphosphonic acid | 1 | 25 | ○ | ○ | ○ |
|  | 14 | Ammonium fluoride | 0.2 | Formic acid | 5 | Propanediamine-tetramethylene-phosphonic acid | 0.05 | 25 | ○ | ○ | ○ |
| Comp. Ex. | 1 | Hydrofluoric acid | 0.5 | — | — | — | — | 25 | X | X | ○ |
|  | 2 | — | — | Sulfuric acid | 20 | — | — | 25 | ○ | ○ | X |
|  | 3 | Tetramethyl-ammonium fluoride | 1.0 | Sulfuric acid | 10 | — | — | 25 | X | Δ | ○ |
|  | 4 | Acidic sodium fluoride | 1.0 | Hydrochloric acid | 15 | — | — | 25 | X | Δ | ○ |
|  | 5 | Hydrofluoric acid | 0.1 | Oxalic acid | 3 | — | — | 25 | X | Δ | ○ |
|  | 6 | Hydrofluoric acid | 0.2 | Hydrochloric acid | 10 | — | — | 60 | X | Δ | ○ |
|  | 7 | Ammonium fluoride | 0.2 | Formic acid | 5 | — | — | 25 | X | ○ | ○ |
| Comp. Ex. | 8 | Hydrofluoric acid | 0.05 | Oxalic acid | 15 | Nitrilo-trismethylene-phosphonic acid | 0.05 | 25 | — | — | — |
|  | 9 | Ammonium fluoride | 0.2 | Sulfuric acid | 55 | 1-Hydroxyethane-1,1-diphosphonic acid | 2 | 25 | X | Δ | ○ |
|  | 10 | Tetramethyl-ammonium fluoride | 0.0005 | Nitric acid | 10 | Nitrilo-trismethylene-phosphonic acid | 0.05 | 25 | ○ | ○ | X |
|  | 11 | Tetramethyl-ammonium fluoride | 15 | Nitric acid | 5 | Nitrilo-trismethylene-phosphonic acid | 0.05 | 25 | X | X | ○ |
|  | 12 | Ammonium fluoride | 0.5 | Hydrochloric acid | 10 | Diethylene-triaminepenta-methylene-phosphonic acid | 0.0005 | 25 | X | Δ | ○ |
|  | 13 | Ammonium fluoride | 0.2 | Formic acid | 10 | Nitrilopropionic acid | 0.05 | 25 | X | Δ | ○ |
|  | 14 | Ammonium fluoride | 0.2 | Formic acid | 10 | Nitrilotriacetic acid | 0.05 | 25 | X | Δ | ○ |

Note:
The balance being water mainly

TABLE 2

| | | Fluorine compound | | Acid | | Chelating agent | | Treatment temp. °C. | Insulating material having high dielectric constant HfSiON | Insulating material th-SiO$_2$ | Metallic material HfSi |
|---|---|---|---|---|---|---|---|---|---|---|---|
| | | Species | Conc. mass % | Species | Conc. mass % | Species | Conc. mass % | | | | |
| Ex. | 15 | Hydrofluoric acid | 0.1 | — | — | Diethylene-triaminepenta-methylene-phosphonic acid | 0.05 | 25 | ○ | ○ | ○ |
| | 16 | Ammonium fluoride | 0.2 | Sulfuric acid | 10 | 1-Hydroxyethane-1,1-diphosphonic acid | 2 | 25 | ○ | ○ | ○ |
| | 17 | Tetramethyl-ammonium fluoride | 0.5 | Sulfuric acid | 10 | 1-Hydroxyethane-1,1-diphosphonic acid | 2 | 25 | ○ | ○ | ○ |
| | 18 | Acidic sodium fluoride | 1.0 | Hydrochloric acid | 15 | Methyl-diphosphonic acid | 1 | 25 | ○ | ○ | ○ |
| | 19 | Acidic sodium fluoride | 1.0 | Hydrochloric acid | 15 | Methyl-diphosphonic acid | 2 | 25 | ○ | ○ | ○ |
| | 20 | Hydrofluoric acid | 0.1 | Hydrochloric acid | 10 | Diethylene-triamine-pentamethylene-phosphonic acid | 1 | 60 | ○ | ○ | ○ |
| | 21 | Acidic sodium fluoride | 1.0 | Hydrochloric acid | 15 | Methyl-diphosphonic acid | 5 | 25 | ○ | ○ | ○ |
| Ex. | 22 | Hydrofluoric acid | 0.05 | Oxalic acid | 3 | Nitrilo-trismethylene-phosphonic acid | 0.05 | 25 | ○ | ○ | ○ |
| | 23 | Tetramethyl-ammonium fluoride | 1 | Nitric acid | 5 | Nitrilo-trismethylene-phosphonic acid | 0.05 | 25 | ○ | ○ | ○ |
| | 24 | Ammonium fluoride | 0.2 | Formic acid | 5 | Nitrilo-trismethylene-phosphonic acid | 0.05 | 25 | ○ | ○ | ○ |
| | 25 | Ammonium fluoride | 0.2 | Formic acid Hydrochloric acid | 5 5 | Methyl-diphosphonic acid | 1 | 25 | ○ | ○ | ○ |
| | 26 | Ammonium fluoride | 0.2 | Formic acid | 5 | 1-Hydroxyethane-1,1-diphosphonic acid | 1 | 25 | ○ | ○ | ○ |
| | 27 | Ammonium fluoride | 0.2 | Formic acid | 5 | Methyl-diphosphonic acid | 1 | 25 | ○ | ○ | ○ |
| | 28 | Ammonium fluoride | 0.2 | Formic acid | 5 | Propanediamine-tetramethylene-phosphonic acid | 0.05 | 25 | ○ | ○ | ○ |
| Comp. Ex. | 15 | Hydrofluoric acid | 0.5 | — | — | — | — | 25 | X | X | ○ |
| | 16 | — | — | Sulfuric acid | 20 | — | — | 25 | ○ | ○ | X |
| | 17 | Tetramethyl-ammonium fluoride | 1.0 | Sulfuric acid | 10 | — | — | 25 | X | Δ | ○ |
| | 18 | Acidic sodium fluoride | 1.0 | Hydrochloric acid | 15 | — | — | 25 | X | Δ | ○ |
| | 19 | Hydrofluoric acid | 0.1 | Oxalic acid | 3 | — | — | 25 | X | Δ | ○ |
| | 20 | Hydrofluoric acid | 0.2 | Hydrochloric acid | 10 | — | — | 60 | X | Δ | ○ |
| | 21 | Ammonium fluoride | 0.2 | Formic acid | 5 | — | — | 25 | X | ○ | ○ |
| Comp. Ex. | 22 | Hydrofluoric acid | 0.05 | Oxalic acid | 15 | Nitrilo-trismethylene-phosphonic acid | 0.05 | 25 | — | — | — |
| | 23 | Ammonium fluoride | 0.2 | Sulfuric acid | 55 | 1-Hydroxyethane-1,1-diphosphonic acid | 2 | 25 | X | Δ | ○ |
| | 24 | Tetramethyl-ammonium fluoride | 0.0005 | Nitric acid | 10 | Nitrilo-trismethylene-phosphonic acid | 0.05 | 25 | ○ | ○ | X |

TABLE 2-continued

| | | Fluorine compound | | Acid | | Chelating agent | | Treatment temp. °C. | Insulating material having high dielectric constant HfSiON | Insulating material th-SiO$_2$ | Metallic material HfSi |
|---|---|---|---|---|---|---|---|---|---|---|---|
| | | Species | Conc. mass % | Species | Conc. mass % | Species | Conc. mass % | | | | |
| | 25 | Tetramethyl-ammonium fluoride | 15 | Nitric acid | 5 | Nitrilo-trismethylene-phosphonic acid | 0.05 | 25 | X | X | ○ |
| | 26 | Ammonium fluoride | 0.5 | Hydrochloric acid | 10 | Diethylene-triaminepenta-methylene-phosphonic acid | 0.0005 | 25 | X | Δ | ○ |
| | 27 | Ammonium fluoride | 0.2 | Formic acid | 10 | Nitrilopropionic acid | 0.05 | 25 | X | Δ | ○ |
| | 28 | Ammonium fluoride | 0.2 | Formic acid | 10 | Nitrilotriacetic acid | 0.05 | 25 | X | Δ | ○ |

Note:
The balance being water mainly

TABLE 3

| | | Fluorine compound | | Acid | | Chelating agent | | Treatment temp. °C. | Insulating material having high dielectric constant HfSiON | Insulating material th-SiO$_2$ | Metallic material HfN |
|---|---|---|---|---|---|---|---|---|---|---|---|
| | | Species | Conc. mass % | Species | Conc. mass % | Species | Conc. mass % | | | | |
| Ex. | 29 | Hydrofluoric acid | 0.1 | — | — | Diethylene-triaminepenta-methylene-phosphonic acid | 0.05 | 25 | ○ | ○ | ○ |
| | 30 | Ammonium fluoride | 0.2 | Sulfuric acid | 10 | 1-Hydroxyethane-1,1-diphosphonic acid | 2 | 25 | ○ | ○ | ○ |
| | 31 | Tetramethyl-ammonium fluoride | 0.5 | Sulfuric acid | 10 | 1-Hydroxyethane-1,1-diphosphonic acid | 2 | 25 | ○ | ○ | ○ |
| | 32 | Acidic sodium fluoride | 1.0 | Hydrochloric acid | 15 | Methyl-diphosphonic acid | 1 | 25 | ○ | ○ | ○ |
| | 33 | Acidic sodium fluoride | 1.0 | Hydrochloric acid | 15 | Methyl-diphosphonic acid | 2 | 25 | ○ | ○ | ○ |
| | 34 | Hydrofluoric acid | 0.1 | Hydrochloric acid | 10 | Diethylene-triamine-pentamethylene-phosphonic acid | 1 | 60 | ○ | ○ | ○ |
| | 35 | Acidic sodium fluoride | 1.0 | Hydrochloric acid | 15 | Methyl-diphosphonic acid | 5 | 25 | ○ | ○ | ○ |
| Ex. | 36 | Hydrofluoric acid | 0.05 | Oxalic acid | 3 | Nitrilo-trismethylene-phosphonic acid | 0.05 | 25 | ○ | ○ | ○ |
| | 37 | Tetramethyl-ammonium fluoride | 1 | Nitric acid | 5 | Nitrilo-trismethylene-phosphonic acid | 0.05 | 25 | ○ | ○ | ○ |
| | 38 | Ammonium fluoride | 0.2 | Formic acid | 5 | Nitrilo-trismethylene-phosphonic acid | 0.05 | 25 | ○ | ○ | ○ |
| | 39 | Ammonium fluoride | 0.2 | Formic acid | 5 | 1-Hydroxyethane-1,1-diphosphonic acid | 1 | 25 | ○ | ○ | ○ |
| | 40 | Ammonium fluoride | 0.2 | Formic acid Hydrochloric acid | 5 5 | Methyl-diphosphonic acid | 1 | 25 | ○ | ○ | ○ |
| | 41 | Ammonium fluoride | 0.2 | Formic acid | 5 | Methyl-diphosphonic acid | 1 | 25 | ○ | ○ | ○ |
| | 42 | Ammonium fluoride | 0.2 | Formic acid | 5 | Propanediamine-tetramethylene-phosphonic acid | 0.05 | 25 | ○ | ○ | ○ |

TABLE 3-continued

| | | Fluorine compound | | Acid | | Chelating agent | | Treatment temp. ° C. | Insulating material having high dielectric constant HfSiON | Insulating material th-SiO$_2$ | Metallic material HfN |
|---|---|---|---|---|---|---|---|---|---|---|---|
| | | Species | Conc. mass % | Species | Conc. mass % | Species | Conc. mass % | | | | |
| Comp. Ex. | 29 | Hydrofluoric acid | 0.5 | — | — | — | — | 25 | X | X | ○ |
| | 30 | — | — | Sulfuric acid | 20 | — | — | 25 | ○ | ○ | X |
| | 31 | Tetramethyl-ammonium fluoride | 1.0 | Sulfuric acid | 10 | — | — | 25 | X | Δ | ○ |
| | 32 | Acidic sodium fluoride | 1.0 | Hydrochloric acid | 15 | — | — | 25 | X | Δ | ○ |
| | 33 | Hydrofluoric acid | 0.1 | Oxalic acid | 3 | — | — | 25 | X | Δ | ○ |
| | 34 | Hydrofluoric acid | 0.2 | Hydrochloric acid | 10 | — | — | 60 | X | Δ | ○ |
| | 35 | Ammonium fluoride | 0.2 | Formic acid | 5 | — | — | 25 | X | ○ | ○ |
| Comp. Ex. | 36 | Hydrofluoric acid | 0.05 | Oxalic acid | 15 | Nitrilo-trismethylene-phosphonic acid | 0.05 | 25 | — | — | — |
| | 37 | Ammonium fluoride | 0.2 | Sulfuric acid | 55 | 1-Hydroxyethane-1,1-diphosphonic acid | 2 | 25 | X | Δ | ○ |
| | 38 | Tetramethyl-ammonium fluoride | 0.0005 | Nitric acid | 10 | Nitrilo-trismethylene-phosphonic acid | 0.05 | 25 | ○ | ○ | X |
| | 39 | Tetramethyl-ammonium fluoride | 15 | Nitric acid | 5 | Nitrilo-trismethylene-phosphonic acid | 0.05 | 25 | X | X | ○ |
| | 40 | Ammonium fluoride | 0.5 | Hydrochloric acid | 10 | Diethylene-triaminepenta-methylene-phosphonic acid | 0.0005 | 25 | X | Δ | ○ |
| | 41 | Ammonium fluoride | 0.2 | Formic acid | 10 | Nitrilopropionic acid | 0.05 | 25 | X | Δ | ○ |
| | 42 | Ammonium fluoride | 0.2 | Formic acid | 10 | Nitrilotriacetic acid | 0.05 | 25 | X | Δ | ○ |

Note:
The balance being water mainly

TABLE 4

| | | Fluorine compound | | Acid | | Chelating agent | | Treatment temp. ° C. | Insulating material having high dielectric constant HfSiON | Insulating material th-SiO$_2$ | Metallic material TaSiN |
|---|---|---|---|---|---|---|---|---|---|---|---|
| | | Species | Conc. mass % | Species | Conc. mass % | Species | Conc. mass % | | | | |
| Ex. | 43 | Hydrofluoric acid | 0.1 | — | — | Diethylene-triaminepenta-methylene-phosphonic acid | 0.05 | 25 | ○ | ○ | ○ |
| | 44 | Ammonium fluoride | 0.2 | Sulfuric acid | 10 | 1-Hydroxyethane-1,1-diphosphonic acid | 2 | 25 | ○ | ○ | ○ |
| | 45 | Tetramethyl-ammonium fluoride | 0.5 | Sulfuric acid | 10 | 1-Hydroxyethane-1,1-diphosphonic acid | 2 | 25 | ○ | ○ | ○ |
| | 46 | Acidic sodium fluoride | 1.0 | Hydrochloric acid | 15 | Methyl-diphosphonic acid | 1 | 25 | ○ | ○ | ○ |
| | 47 | Acidic sodium fluoride | 1.0 | Hydrochloric acid | 15 | Methyl-diphosphonic acid | 2 | 25 | ○ | ○ | ○ |

TABLE 4-continued

| | | Fluorine compound | | Acid | | Chelating agent | | Treatment temp. °C. | Insulating material having high dielectric constant HfSiON | Insulating material th-SiO$_2$ | Metallic material TaSiN |
|---|---|---|---|---|---|---|---|---|---|---|---|
| | | Species | Conc. mass % | Species | Conc. mass % | Species | Conc. mass % | | | | |
| Ex. | 48 | Hydrofluoric acid | 0.1 | Hydrochloric acid | 10 | Diethylene-triamine-pentamethylene-phosphonic acid | 1 | 60 | ○ | ○ | ○ |
| | 49 | Acidic sodium fluoride | 1.0 | Hydrochloric acid | 15 | Methyl-diphosphonic acid | 5 | 25 | ○ | ○ | ○ |
| | 50 | Hydrofluoric acid | 0.05 | Oxalic acid | 3 | Nitrilo-trismethylene-phosphonic acid | 0.05 | 25 | ○ | ○ | ○ |
| | 51 | Tetramethyl-ammonium fluoride | 1 | Nitric acid | 5 | Nitrilo-trismethylene-phosphonic acid | 0.05 | 25 | ○ | ○ | ○ |
| | 52 | Ammonium fluoride | 0.2 | Formic acid | 5 | Nitrilo-trismethylene-phosphonic acid | 0.05 | 25 | ○ | ○ | ○ |
| | 53 | Ammonium fluoride | 0.2 | Formic acid | 5 | 1-Hydroxyethane-1,1-diphosphonic acid | 1 | 25 | ○ | ○ | ○ |
| | 54 | Ammonium fluoride | 0.2 | Formic acid / Hydrochloric acid | 5 / 5 | Methyl-diphosphonic acid | 1 | 25 | ○ | ○ | ○ |
| | 55 | Ammonium fluoride | 0.2 | Formic acid | 5 | Methyl-diphosphonic acid | 1 | 25 | ○ | ○ | ○ |
| | 56 | Ammonium fluoride | 0.2 | Formic acid | 5 | Propanediamine-tetramethylene-phosphonic acid | 0.05 | 25 | ○ | ○ | ○ |
| Comp. Ex. | 43 | Hydrofluoric acid | 0.5 | — | — | — | — | 25 | X | X | ○ |
| | 44 | — | — | Sulfuric acid | 20 | — | — | 25 | ○ | ○ | X |
| | 45 | Tetramethyl-ammonium fluoride | 1.0 | Sulfuric acid | 10 | — | — | 25 | X | Δ | ○ |
| | 46 | Acidic sodium fluoride | 1.0 | Hydrochloric acid | 15 | — | — | 25 | X | Δ | ○ |
| | 47 | Hydrofluoric acid | 0.1 | Oxalic acid | 3 | — | — | 25 | X | Δ | ○ |
| | 48 | Hydrofluoric acid | 0.2 | Hydrochloric acid | 10 | — | — | 60 | X | Δ | ○ |
| | 49 | Ammonium fluoride | 0.2 | Formic acid | 5 | — | — | 25 | X | ○ | ○ |
| Comp. Ex. | 50 | Hydrofluoric acid | 0.05 | Oxalic acid | 15 | Nitrilo-trismethylene-phosphonic acid | 0.05 | 25 | — | — | — |
| | 51 | Ammonium fluoride | 0.2 | Sulfuric acid | 55 | 1-Hydroxyethane-1,1-diphosphonic acid | 2 | 25 | X | Δ | ○ |
| | 52 | Tetramethyl-ammonium fluoride | 0.0005 | Nitric acid | 10 | Nitrilo-trismethylene-phosphonic acid | 0.05 | 25 | ○ | ○ | X |
| | 53 | Tetramethyl-ammonium fluoride | 15 | Nitric acid | 5 | Nitrilo-trismethylene-phosphonic acid | 0.05 | 25 | X | X | ○ |
| | 54 | Ammonium fluoride | 0.5 | Hydrochloric acid | 10 | Diethylene-triaminepenta-methylene-phosphonic acid | 0.0005 | 25 | X | Δ | ○ |
| | 55 | Ammonium fluoride | 0.2 | Formic acid | 10 | Nitrilopropionic acid | 0.05 | 25 | X | Δ | ○ |
| | 56 | Ammonium fluoride | 0.2 | Formic acid | 10 | Nitrilotriacetic acid | 0.05 | 25 | X | Δ | ○ |

Note:
The balance being water mainly

INDUSTRIAL APPLICABILITY

When the etchant composition of the present invention is employed for etching of a metallic material, selective etching of the metallic material, which is difficult to perform only through a conventional etching technique employing plasma gas, can be achieved. In addition, the etchant composition of the present invention can suppress corrosion of an insulating material having high dielectric constant or an insulating material of oxide film or nitride film.

The invention claimed is:

1. An etchant composition having a property of selectively etching a metallic material in production of a semiconductor device from an insulating material having high dielectric constant, an insulating material of silicon oxide film or silicon nitride film, and the metallic material, characterized in that the etchant composition is an aqueous solution containing a fluorine compound, a chelating agent having, in a molecular structure thereof, a phosphorus oxo-acid as a functional group, and at least one of an inorganic acid and an organic acid, wherein when the inorganic acid is contained in the aqueous solution, the inorganic acid is contained in an amount of 50% by mass or less, and when the organic acid is contained in the aqueous solution, the organic acid is contained in an amount of 15% by mass or less, and wherein said chelating agent is at least one selected from the group consisting of diphosphonic acids, nitrilomethylenephosphonic acids and pentamethylenephosphonic acids, wherein the inorganic acid, when contained in the aqueous solution, is contained in an amount with a range of 5 to 50% by mass, and the organic acid, when contained in the aqueous solution, is contained in an amount within a range of 3 to 15% by mass, wherein the amount of the fluorine compound is 0.5 to 10mass %.

2. An etchant composition as described in claim 1, wherein the amount of the fluorine compound is 0.001 to 10 mass %, and the amount of the chelating agent having, in the molecular structure thereof, a phosphorus oxo-acid as a functional group, is 0.001 to 10 mass %.

3. An etchant composition as described in claim 1, wherein the fluorine compound is at least one species selected from the group consisting of hydrofluoric acid, ammonium fluoride, tetramethylammonium fluoride, sodium fluoride, and potassium fluoride.

4. An etchant composition as described in claim 1, wherein the inorganic acid is at least one species selected from the group consisting of sulfuric acid, nitric acid, hydrochloric acid, phosphoric acid, sulfamic acid, nitrous acid, and amidosulfuric acid.

5. An etchant composition as described in claim 1, wherein the organic acid is at least one species selected from the group consisting of formic acid, oxalic acid, citric acid, malonic acid, succinic acid, acetic acid, propionic acid, malic acid, and tartaric acid.

6. An etchant composition as described in claim 1, wherein the metallic material is Al, Co, Cr, Cu, Fe, Hf, Mo, Nb, Ni, Pt, Ru, Ta, Ti, W, or Zr; or a material containing any of these metals and a silicon atom and/or a nitrogen atom.

7. An etchant composition as described in claim 1, wherein the insulating material having high dielectric constant is $Al_2O_3$, $CeO_3$, $Dy_2O_3$, $Er_2O_3$, $Eu_2O_3$, $Gd_2O_3$, $HfO_2$, $Ho_2O_3$, $La_2O_3$, $Lu_2O_3$, $Nb_2O_5$, $Nd_2O_3$, $Pr_2O_3$, $ScO_3$, $Sm_2O_3$, $Ta_2O_5$, $Tb_2O_3$, $TiO_2$, $Tm_2O_3$, $Y_2O_3$, $Yb_2O_3$, or $ZrO_2$; or a material containing any of these metal oxides and a silicon atom and/or a nitrogen atom.

8. A method for producing a semiconductor device characterized by comprising selectively etching a metallic material by use of an etchant composition as recited in claim 1, without causing corrosion of an insulating material having high dielectric constant or an insulating material of silicon oxide film or silicon nitride film.

9. An etchant composition as described in claim 2, wherein the fluorine compound is at least one species selected from among hydrofluoric acid, ammonium fluoride, tetramethylammonium fluoride, sodium fluoride, and potassium fluoride.

10. An etchant composition as described in claim 2, wherein the metallic material is Al, Co, Cr, Cu, Fe, Hf, Mo, Nb, Ni, Pt, Ru, Ta, Ti, W, or Zr; or a material containing any of these metals and a silicon atom and/or a nitrogen atom.

11. An etchant composition as described in claim 2, wherein the insulating material having high dielectric constant is $Al_2O_3$, $CeO_3$, $Dy_2O_3$, $Er_2O_3$, $Eu_2O_3$, $Gd_2O_3$, $HfO_2$, $Ho_2O_3$, $La_2O_3$, $Lu_2O_3$, $Nb_2O_5$, $Nd_2O_3$, $Pr_2O_3$, $ScO_3$, $Sm_2O_3$, $Ta_2O_5$, $Tb_2O_3$, $TiO_2$, $Tm_2O_3$, $Y_2O_3$, $Yb_2O_3$, or $ZrO_2$; or a material containing any of these metal oxides and a silicon atom and/or a nitrogen atom.

12. An etchant composition as described in claim 1, wherein the etchant composition is employed under alkaline conditions, and further includes ammonia, an amine, or a quaternary ammonium hydroxide.

13. An etchant composition as described in claim 1, wherein the etchant composition is employed under acidic conditions, and includes an organic acid or inorganic acid in addition to said at least one of an inorganic acid and an organic acid.

14. An etchant composition as described in claim 1, which is an aqueous solution consisting essentially of said fluorine compound, said chelating agent and said at least one of said inorganic acid and said organic acid.

15. An etchant composition as described in claim 1, which is an aqueous solution consisting of said fluorine compound, said chelating agent and said at least of said inorganic acid and said organic acid.

16. An etchant composition as described in claim 1, wherein the etchant composition includes said inorganic acid and said organic acid.

* * * * *